United States Patent [19]

Cederbaum et al.

[11] Patent Number: 5,100,817

[45] Date of Patent: Mar. 31, 1992

[54] METHOD OF FORMING STACKED SELF-ALIGNED POLYSILICON PFET DEVICES AND STRUCTURES RESULTING THEREFROM

[75] Inventors: Carl Cederbaum, Paris; Roland Chanclou, Perthes; Myriam Combes, Evry; Patrick Moné, Ponthierry, all of France

[73] Assignee: International Business Machines Corporation, Armonk, N.Y.

[21] Appl. No.: 729,250

[22] Filed: Jul. 12, 1991

[30] Foreign Application Priority Data

Jul. 31, 1990 [EP] European Pat. Off. ......... 90480112.3

[51] Int. Cl.$^5$ ............................................ H01L 21/265
[52] U.S. Cl. ......................................... 437/41; 437/56; 437/57; 437/200; 437/915; 437/245; 437/913; 437/52
[58] Field of Search ...................... 437/41, 195, 52, 56, 437/915, 245, 200, 59, 913, 57, 58

[56] References Cited

U.S. PATENT DOCUMENTS

| | | | |
|---|---|---|---|
| 4,498,226 | 2/1985 | Inoue et al. | 437/915 |
| 4,795,722 | 1/1989 | Welch et al. | 437/245 |
| 4,868,137 | 9/1989 | Kubota | 437/41 |
| 4,902,637 | 2/1990 | Kondou et al. | 437/56 |
| 4,987,099 | 1/1991 | Flanner | 437/245 |

FOREIGN PATENT DOCUMENTS

| | | | |
|---|---|---|---|
| 0223920 | 7/1986 | European Pat. Off. | |
| 0056456 | 4/1983 | Japan | 437/915 |
| 0253228 | 10/1989 | Japan | 437/195 |
| 0268151 | 10/1989 | Japan | 437/195 |
| 0076233 | 3/1990 | Japan | 437/195 |

Primary Examiner—Brian E. Hearn
Assistant Examiner—Michael Trinh
Attorney, Agent, or Firm—Richard A. Romanchik

[57] ABSTRACT

A stacked semiconductor structure including a base structure (18/19) is comprised of a semiconductor substrate having active regions (21) of devices (N1, ... ) formed therein and/or a plurality of polysilicon lines (23-1, ... ) formed thereupon; a first thick passivating layer (26/27) having a set of first metal contact studs (30-1, ... ) therein contacting at least one of said active regions (21) and/or said polysilicon lines (23-1, ... ), the surface of said first metal contact studs being coplanar with the surface of said first thick passivating layer; a plurality of first polysilicon lands (31-1, ... ) formed on the said thick passivating layer, certain portions of said first polysilicon lands defining the source, drain and channel regions forming the body of a PFET device with at least one region (SP1) contacting one of said first metal contact studs; a thin insulating layer (33) forming the gate dielectric layer of said PFET device; a plurality of highly doped second polysilicon lands (35-1A, ... ) formed over by said thin insulating layer (33); a certain portion of said second polysilicon lands (35-1A, ... ) forming the gate electrode (GP1) of said PFET device (SP1) which is self-aligned with said source (SP1) and drain (DP1) regions; a second thick passivating layer (37/38) having a set of second metal contact studs (40-1, ... ) therein contacting at least one of said first or second polysilicon lands (31-1, ... ; 35-1, ... ) and/or said first contact studs (30-1, ... ); the surface of said second metal contact studs is coplanar with the surface of said second thick passivating layer; a first metal interconnection configuration having metal lands (41-1, ... ) electrically contacting at least one of said second metal contact studs (40-1, ... ); and, a final insulating film (42).

14 Claims, 7 Drawing Sheets

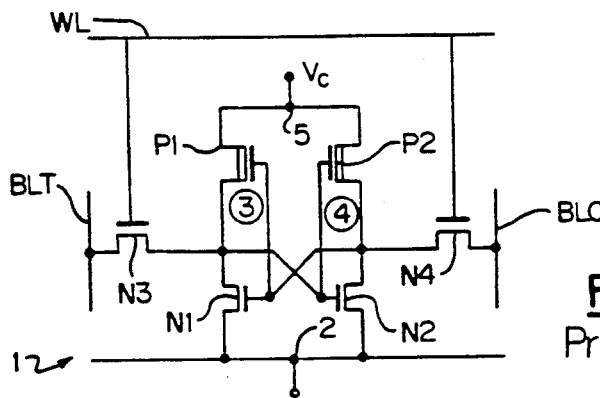
FIG.1
Prior Art
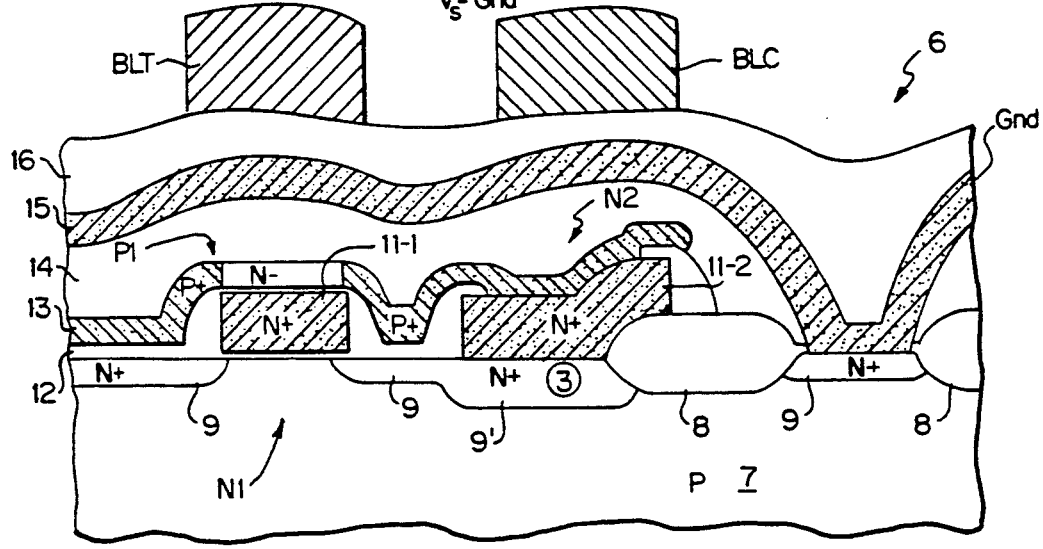
FIG.2
Prior Art
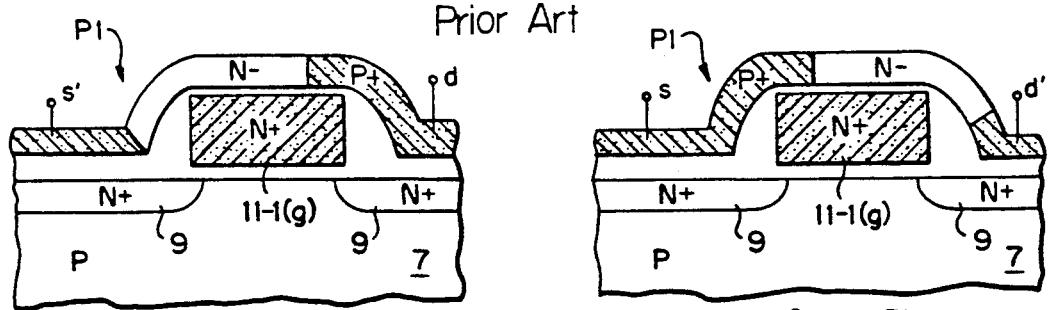
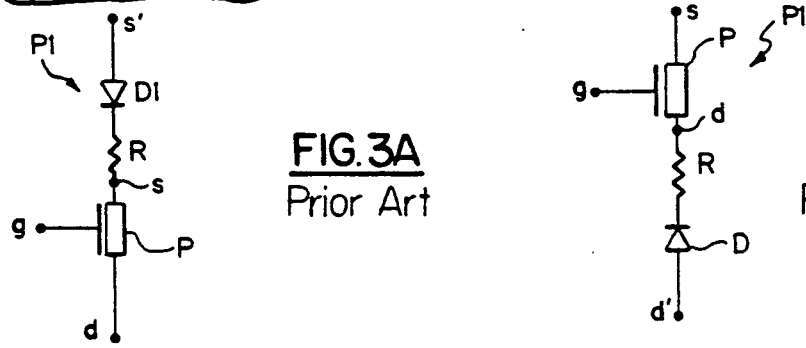
FIG.3A
Prior Art
FIG.3B
Prior Art

METHOD OF FORMING STACKED SELF-ALIGNED POLYSILICON PFET DEVICES AND STRUCTURES RESULTING THEREFROM

TECHNICAL FIELD

The present invention relates to Integrated Circuit manufacturing and more specifically, to a method of forming stacked, self-aligned polysilicon gate PFET devices in semiconductor chips and to the structures resulting therefrom. In particular, the method has applicability in the forming of stacked self-aligned polysilicon gate PFETs to be used as load devices in six device (6D) SRAM cells.

BACKGROUND ART

Polycrystalline silicon (polysilicon) resistors are commonly used as load devices in a variety of digital and analog applications, and in particular, in Static Random Access Memories (SRAMs). SRAM cells with resistive loads are hereinafter referred to as the 4D/2R SRAM cells. Stacking polysilicon load resistors above the NFETs in 4D/2R SRAM cells is much appreciated in the design of the SRAM chip layout, because it results in a significant reduction in the SRAM cell size due to the fact that the cell area is only determined by the area used by the NFETs. It is now a general practice in the industry to have the load resistors of 4D/2R SRAM cells formed by resistive polysilicon lands obtained from a very thin layer of either intrinsic or lightly doped polysilicon material. However, because these load resistors must be fairly high-valued, i.e. in the tera-ohms ($10^{12}\Omega$) range or above, limitations on the current drawn by the cell results in a limit of 1 megabit capacity of 4D/2R SRAM cell chips. As a matter of act, for increased capacities, the polysilicon layer must be so thin that the process tolerances are too difficult to control. In addition, 4D/2R SRAM cells are also very sensitive to soft errors produced by alpha particles. For memory larger than 1 megabit, stacked PFETs instead of polysilicon resistors have to be used as load devices, although this is at the cost of a significantly more complicated manufacturing process.

FIG. 1 shows a conventional 6D SRAM cell circuit, referenced 1, with PFETs as load devices. Two cross-coupled NFETs N1 and N2, referred to as the driver transistors, are connected between common node 2, which is tied to a first supply voltage Vs (usually the ground Gnd), and respective nodes 3 and 4, hereinafter referred to as charge storage nodes. These nodes 3, 4 are connected to a common node 5 which is tied to a second supply voltage (usually a positive voltage Vc), respectively, through PFETs P1 and P2. Nodes 3 and 4 are also respectively connected to the bit lines BLT and BLC through NFETs N3 and N4, hereinafter referred to as to access transistors. The gate electrodes of NFETs N3 and N4 are connected to the word line WL for READ and WRITE operations.

FIG. 2 is a partial cross-sectional view of the structure of the 6D SRAM cell circuit of FIG. 1 when integrated in a semiconductor substrate according to a conventional CMOS manufacturing process offering stacked polysilicon gate PFET devices (sPFETs). The structure referenced 6 is a good example of the advanced state of the art known to date and is extracted from an article entitled: "A .1 $\mu$A stand-by current ground-bounce-immune 1-M bit CMOS SRAM by M. Ando et al, published in the IEEE JSSC vol. 24, N° 6, Dec. 89, pp. 1708-1713. Reference numeral 7 indicates the P type silicon substrate. Numerals 8 indicate the different field recess oxide (ROX) regions that are used to isolate the different active regions of the structure. Numerals 9 are active N+ implanted source and drain regions of the NFETs. Numeral 12 indicates the gate dielectric layer, typically an $SiO_2$ layer. The highly doped N+ polysilicon gate electrodes of driver NFETs N1 and N2 are respectively referenced 11-1 and 11-2. Polysilicon gate electrode 11-2 forms a buried contact with region 9' which is a protrusion of the drain region 9 of NFET N1. The gate electrodes 11-1 and 11-2 and the source and drain regions of NFETs N1 and N2 are covered by a thin insulating protective layer 12 of $SiO_2$, which also forms oxide sidewalls or spacers on the lateral sides of gate electrode 11-1 of NFET N1. A polysilicon land 13 surmounts gate electrodes 11-1 and 11-2 and is isolated therefrom by the $SiO_2$ layer 12. Polysilicon land 13 results from the patterning and selective doping of an intrinsic or lightly doped polysilicon layer that has been deposited to form the body of sPFETs. As apparent from FIG. 2, this polysilicon land 13 is highly doped with a P type dopant except just above gate electrode 11-1. The undoped region forms the channel region of the sPFET P1 while the adjacent P+ doped regions form the source and drain regions thereof. An extension of the drain region of sPFET P1, referred to as the extended drain region, contacts the small portion of gate electrode 11-2, which is exposed through an opening in oxide layer 12. N+ doped gate electrode 11-1 of NFET N1 also serves as the gate electrode of sPFET P1, while layer 12 is the gate dielectric thereof. For each cell, oxide layer 12 is opened in all locations where it is necessary to make a contact between the N+ doped polysilicon gate electrode of a NFET and the adjacent P+ extended drain region of the corresponding sPFET. Note that region 9, protrusion 9', gate electrode 11-2, and the extended drain region of sPFET P1 13 are at the potential of node 3, thereby achieving the desired cross-coupling of the devices as illustrated in the cell circuit of FIG. 1. At this stage of the process, the structure is said to have completed the Master Slice processing steps of a polysilicon gate CMOS FET technology. The structure is consequently passivated by a relatively thick insulating $SiO_2$ layer 14 of about 500 nm. All of the aforementioned components 7-14 of the structure 6 result from the FEOL (Front End Of the Line) processing.

Elements that will now be described are formed during the personalization steps or BEOL (Back End Of the Line) processing. Numeral 15 is a typical example of a polycide land or line used as a power bus. In FIG. 2, polycide land 15 connects a N+ active region 9 (the source region of a NFET not illustrated in FIG. 2) to Gnd and is hereinafter referred to as the Gnd bus. An additional insulating $SiO_2$ layer 16 terminates the structure. Layer 16 is provided with contact openings (not shown) to allow appropriate contacting with the metal bit lines BLT and BLC and power busses (e.g. the Vc power bus). As apparent from FIG. 2, all the succeeding layers, and in particular polysilicon layer 13, are conformally deposited, thereby resulting in the typical "corrugated" relief aspect of the upper layers of structure 6.

The cell construction of FIG. 2, wherein PFETs used as load devices are stacked above NFETs, is of great interest in terms of density, because the cell area is only determined by the area of NFETs. However, the disclosed semiconductor structure and its corresponding manufacturing process have some major inconveniences which are recited below.

1. The said conventional manufacturing process is not of the self-aligned type. Self-aligned processes combined with oxide spacers are preferred in order to avoid hot electrons and punch-through problems. In the structure of FIG. 2, no oxide spacers on the sidewalls of gate electrodes are provided to the sPFETs.

2. The structure of FIG. 2 requires six additional masks with respect to a conventional manufacturing process of 6D SRAM cell chips not offering sPFETs. The first mask is used to remove the gate oxide layer 10 above protruded source region 9' of NFET N1 to allow the buried contact between gate electrode 11-2 and said region 9'. The second mask makes an opening above gate electrode 11-2. The third mask delineates the N type lightly doped polysilicon layer 13. The third mask is used to shape the desired polysilicon land wherein sPFET P1 and its related extended drain region (for connection with underlying gate electrode 11-2). The fourth mask is a block-out mask that is required to protect the channel region of sPFET P1 from the implantation of P type dopants, while forming the highly doped P+ source and drain regions thereof, along with said extended drain region. The fifth mask defines contact openings where polycide lands conveying the Gnd potential contact source regions 9 of NFETs e.g. driver transistors. An example of a Gnd bus is shown in FIG. 2. Also, the sixth mask delineates polycide land such as the word lines and some power busses.

3. sPFET P1 is dependent upon the underlying NFET N1 size and lay-out which in turn, results in less flexibility in the design. Because the gate electrode 11-1 of NFET N1 is also the gate electrode of sPFET P1, the layout of the two devices are strongly coupled both in terms of device size and device lay-out. More generally, since the gate length of the NFET (e.g. N1) must be at the minimum allowed by the lithography for maximum performance, so must be the gate length of the corresponding sPFET (e.g. P1). This constitutes a potential source of reliability hazards. For example, if the out-diffusion of the P+ dopants contained in the implanted source and drain regions of the sPFET P1 is not well controlled, the source and drain regions get too large, thereby reducing the effective channel length of sPFET P1. As a consequence, punch-through problems can occur. The channel length of sPFET P1 cannot be increased since this length is dictated by the performance requirements of NFET N1 as mentioned above. In addition, since the block-out mask defining the channel region of sPFET P1 is also at minimum image size, alignment tolerance between this block-out mask and the channel region can result in a channel region not correctly aligned with the gate electrode.

FIGS. 3A and 3B illustrate the effect of misalignment on sPFET P1 as to the introduction of parasitic devices to an ideal PFET P (that would be obtained should misregistration not exist), that has inherently poor performance. In the first case (positive misalignment) shown in FIG. 3A, the diode D (forwardly-biased) and a high value resistor R are in series with the source region s of the ideal PFET P. These parasitic devices decrease the effective gate to source overdrive voltage (VGS- VT) of sPFET P1 (which has already a high threshold voltage VT) and hence will decrease the "ON" current of sPFET P1. In the second case (negative misalignment), shown in FIG. 3B, the parasitic devices: resistor R and diode D (now reversely-biased) are in series with the drain region d of the ideal PFET P and similarly decrease the current capability of sPFET P1. As a result, the latter is far from an ideal PFET P.

4. The gate electrode of the sPFET P1 does not have an optimized work function. Since both NFET N1 and the corresponding sPFET P1 formed thereupon share the same N+ gate electrode 11-1, the gate electrode of the sPFET is therefore of the N+ type while P+ type would have been preferred. It is well recognized that this situation creates punch-through problems, because in this case, the channel region is buried instead of being in surface. Punch-through effects induce leakage currents which are critical for the SRAM cell stand-by power consumption.

5. As pointed out above in conjunction with FIG. 2, the conventional manufacturing process results in a non planarized structure 6. The gate oxide layer 12 and the polysilicon layer 13 forming sPFET P1 are deposited over the castellated topology of the NFET N1 gate electrode 11-1, although slightly smoothed by protective layer 12, thereby creating reliability problems known as "step coverage", since polysilicon layer 13 is much thinner than gate electrode 11-1.

6. A parasitic P+/N+ diode is formed between N+ gate electrode 11-2 of NFET N2 and the P+ extended drain region of sPFET P1. This diode deteriorates the contact quality which is no longer of the ohmic type, thereby slowing down the SRAM cell performance.

7. The word lines WL, some power busses and possibly the local interconnect scheme that makes straps and short distance connections at the silicon wafer level, are made of polycide. Polycide is a quite good conductive material, however it is known to exhibit higher resistivities than metal.

8. Finally, the structure of FIG. 2 has a poor design flexibility because of the difficult contacting of source region of sPFET P1 to Vc power bus because the presence of the polycide lands 15.

DISCLOSURE OF THE INVENTION

An object of the present invention is to provide a method of forming stacked self-aligned polysilicon gate PFET devices according to a self-aligned technique, wherein said devices are provided with spacers to reduce punch-through problems.

Another object of the present invention is to provide a method of forming stacked self-aligned polysilicon gate PFET devices that requires a reduced number of masking steps.

Yet another object of the present invention is to provide a method of forming stacked self-aligned polysilicon gate PFET devices that is independent of NFET device size and lay out, thereby avoiding potential problems related to misregistration.

Yet another object of the present invention is to provide a method of forming stacked self-aligned polysilicon gate PFET devices wherein the gate electrodes of said devices are made of P+ polysilicon for adequate work function.

Yet another object of the present invention is to provide a method of forming stacked self-aligned polysilicon gate PFET devices wherein said devices are formed on planar surfaces for better reliability.

Yet another object of the present invention is to provide a method of forming stacked self-aligned polysilicon gate PFET devices wherein no parasitic diodes are produced in the contacts.

Yet another object of the present invention is to provide a method of forming stacked self-aligned polysilicon gate PFET devices wherein word lines and power busses are all made of metal for improved conductivity.

Yet another object of the present invention is to provide a method of forming stacked self-aligned polysilicon gate PFET devices offering quite good design flexibility for easy contacting of the source regions of PFET devices to the Vc power bus.

According to the invention, a stacked semiconductor structure includes a base structure comprised of a semiconductor substrate having active regions of devices formed therein and a plurality of polysilicon lines formed thereupon after completion of the Master Slice processing steps characterized in that it further includes:

a first thick passivating layer disposed on said base structure having a set of first metal contact studs therein contacting at least one of said active regions and/or said polysilicon lines; the surface of said first metal contact studs is coplanar with the surface of said first thick passivating layer;

a plurality of first polysilicon lands formed on the said thick passivating layer, certain portion of said first polysilicon lands define the source, drain and channel regions forming the body of a PFET device; at least one region contacting one of said first metal contact studs;

a thin insulating layer disposed onto the resulting structure forming the gate dielectric layer of said PFET device;

a plurality of highly doped second polysilicon lands formed over said thin insulating layer; certain portion of said second polysilicon lands forming the gate electrode of said PFET device which is self-aligned with said source and drain regions; and a second thick passivating layer disposed onto the resulting structure having a set of second metal contact studs therein contacting at least one of said first or second polysilicon lands and/or said first contact studs; the surface of said second metal contact studs is coplanar with the surface of said second thick passivating layer.

The manufacturing method used to produce this stacked semiconductor structure includes the following sequence of steps:

a) depositing a first thick passivating layer of a dielectric material that can be planarized onto the said base structure;

b) forming a set of first stud openings in said first thick passivating layer exposing at least one active region and/or one of said polysilicon lines;

c) depositing a first layer of a conductive material, to fill said first stud openings and define a set of first contact studs;

d) planarizing the structure to make the top surface of said first contact-studs coplanar with the surface of said first thick passivating layer;

e) depositing a first polysilicon layer lightly doped with an impurity of a first type of conductivity;

f) patterning said polysilicon layer to define a plurality of first polysilicon lands to be used either as the body of PFET devices and/or interconnection conductors contacting said first contact studs at desired locations;

g) depositing a thin insulating layer to form the gate dielectric of PFET devices and patterning it to define contact openings to expose certain first contact studs at desired locations;

h) depositing a second layer of polysilicon and patterning it to define a plurality of second polysilicon lands, to be used either as the gate electrodes of the said PFET devices or as interconnection conductors, contacting first contact studs through said contact openings;

i) blanket implanting ions of a second type of conductivity to define in particular self-aligned source and drain regions in said first polysilicon lands using the said gate electrodes of PFET devices as a block-out mask and dope said interconnection conductors;

j) depositing a cap layer at least over said second polysilicon lands;

k) depositing a second thick passivating layer of a dielectric material that can be planarized;

l) forming a set of second stud openings in said second thick passivating layer to expose desired portions of said first and/or second polysilicon lands and/or portions of said first contact studs;

m) depositing a second layer of a conductive material to fill said second stud openings and define a set of second contact studs; and, n) planarizing the structure to make the top surface of said second contact studs coplanar with the surface of said second thick passivating layer.

Preferably, said conductive material is a metal, typically tungsten and said ions of a second type of conductivity are boron ions.

Compared to the prior art approach described in conjunction with the structure of FIG. 2, the present method of forming stacked self-aligned polysilicon gate PFET devices and the structures resulting therefrom have the following advantages:

1. It is a self-aligned process.
2. Only three extra masks are required.
3. The sPFET is independent of the underlying NFET size and layout.
4. The sPFET is controlled by a P+ doped polysilicon gate electrode.
5. The sPFET device is formed onto a planarized surface.
6. The N+/P+ diode contact structure is replaced by a tungsten contact stud forming an ohmic contact.
7. Word Line WL, Gnd and Vc power busses are made of metal instead of polycide.
8. Very high design flexibility which allows easy contacting of the sPFET source regions to the Vc power bus.

These and other objects and advantages thereof, may best be understood by reference to the following detailed description of an illustrated preferred embodiment to be read in conjunction with the accompanying drawings.

BRIEF DESCRIPTION OF THE DRAWINGS

FIG. 1 is a schematic diagram of a conventional 6D SRAM cell circuit including two PFETs as load devices.

FIG. 2 is a cross-sectional view, partially broken away, of the structure of the 6D SRAM cell circuit of FIG. 1 when integrated in a silicon substrate according to a conventional CMOS FET manufacturing process offering stacked polysilicon gate PFET devices.

FIG. 3A is a cross-sectional view, partially broken away, of the PFET device structure of FIG. 2, utilizing positive mask misregistration, and a schematic diagram of the parasitic device introduced thereby.

FIG. 3B is a cross-sectional view, partially broken away, of the PFET device structure of FIG. 2, utilizing negative mask misregistration, and a schematic diagram of the parasitic device introduced thereby.

BEST MODE FOR CARRYING OUT THE INVENTION

Figure 4:
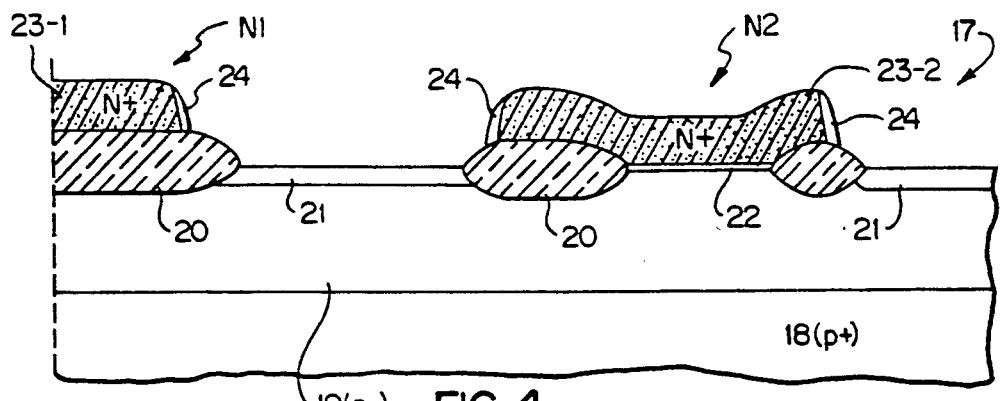
FIG. 4 shows a partial cross-sectional view of a conventional base structure of the 6D SRAM cell of FIG. 1 after having completed the Master Slice processing steps of a standard CMOS FET manufacturing process.

FIG. 4 shows a partial cross-sectional view of a conventional base structure of the prior art after source-/drain region and polysilicon gate electrode formation that results from a standard CMOS manufacturing process. The disclosed portion shows structural parts of the driver NFETs N1 and N2 of the 6D SRAM cell circuit of FIG. 1 and is comparable in some respect with the structure shown in FIG. 2. In FIG. 4, the whole structure is designated by reference 17 and is briefly described thereafter. The starting material consists of a conventional P+ silicon substrate 18 having a P⁻ epitaxial layer 19 thereon. ROX regions 20 are used as it is well known for the skilled man to isolate active regions one from the others at the surface of the wafer. N+ implanted active regions 21 have been formed in the epitaxial layer 19 to constitute the source and drain regions of the NFETs. Active regions 21 are generally provided with a thin $TiSi_2$ contact layer to reduce their sheet resistance, thereby improving electrical contact quality with the contact studs yet to be formed. The gate dielectric layer, typically an $SiO_2$ layer, is referenced 22. Numerals 23 indicate the remaining portions of the N+ highly doped polysilicon layer 23 that has been patterned to create the polysilicon gate electrodes. Numerals 23-1 and 23-2 designate respectively the gate electrodes of NFETs N1 and N2. Oxide sidewalls or spacers 24 have been formed on the lateral sides of the polysilicon gate electrodes for a better definition of the channel length of NFETs. The above-described device structure of FIG. 4 is shown for the purpose of illustrating the present invention, and is a conventional structure in the art, amenable to fabrication by the use of many known semiconductor CMOS FET manufacturing processes, but is not limited to CMOS technology. It is to be noted that, the remaining polysilicon portions are not limited to gate electrodes, they could be lands used as conductors, as such forming the extrinsic base contact in a polysilicon self-aligned bipolar transistor manufacturing process. Consequently, the remaining polysilicon portions 23 will be referred to more generally as polysilicon lines. Also, active regions 21 are not limited to source and drain regions of FETs, but also include emitter, base and collector regions of bipolar devices. Taking into account that the structure of FIG. 4 could be adapted to result either from a bipolar, CMOS or BiCMOS manufacturing process, any base structure, at the stage of FIG. 4, is said to have completed the Master Slice processing steps. In other words, the active regions 21 (irrespective of the type of devices formed therein), and optionally, polysilicon lines 23-1, . . . have been formed.

Now a preferred embodiment of the method of the present invention will be described with reference to FIGS. 5 to 14.

1) First, the wafer having a structure according to FIG. 4 is cleaned by dipping in a tank containing an $H_2SO_4/H_2O_2$ (4:1) acidic solution. This cleaning step will hereinafter be referred to as the Piranha clean. A thin (about 50 nm) $Si_3N_4$ diffusion barrier layer (not shown) is then blanket deposited over the wafer. The $Si_3N_4$ diffusion barrier layer avoids potential dissolution of the $TiSi_2$ layer in the upper layers to be subsequently formed. This step is completed in a standard LPCVD equipment at 785° C. with a $SiH_2Cl_2/NH_3$ reactive gas. An intrinsic polysilicon etch stop layer 25 is then conformally deposited over the surface of the wafer using conventional CVD process to a thickness in the range of 50 nm. The etch stop layer is used to protect the bird's beak of the ROX regions should a contact stud overlying both silicon (e.g. at a source/drain region) and $SiO_2$ (e.g. at a ROX region) be required. The material forming this etch stop layer must have a good etching selectivity with the phosphosilicate glass (PSG) layer 26 to be subsequently formed. $Al_2O_3$ is suitable, but intrinsic polysilicon is preferred, because it has not only the desirable high etch ratio with PSG, (about 25:1), but it is easier to etch. The structure is cleaned again in two steps: first, using the Piranha clean followed by a clean in an $H_2O/HCl/H_2O_2$ (5:1:1) acidic solution, (hereinafter referred to as a Hung B clean), then rinsed. The PSG layer 26 is now deposited conformally at 400° C., using a $SiH_4/PH3$ gas with $N_2$ as the carrier gas in a APCVD reactor to reach a thickness of 900 nm. Optionally, a 200 nm thick intermediate pyrolitic $SiO_2$ layer (not shown) can be inserted between intrinsic polysilicon layer 25 and PSG layer 26 to protect the intrinsic polysilicon layer 22 from the phosphorous dopants contained in the PSG layer 26. The deposition is achieved in a PECVD tool, at 440° C. in an $O_2/SiH_4/N_2$ ambient. Next, the PSG layer 26 is chem-mech polished for fine planarization using a solution of colloidal $SiO_2$ in water, (e.g. the slurry referenced SC1 sold by SPEAR CARBO). After polishing, the remaining thickness is 600 nm. This step is followed by a post-clean in a SVG double-sided brush cleaner.

Figure 5:
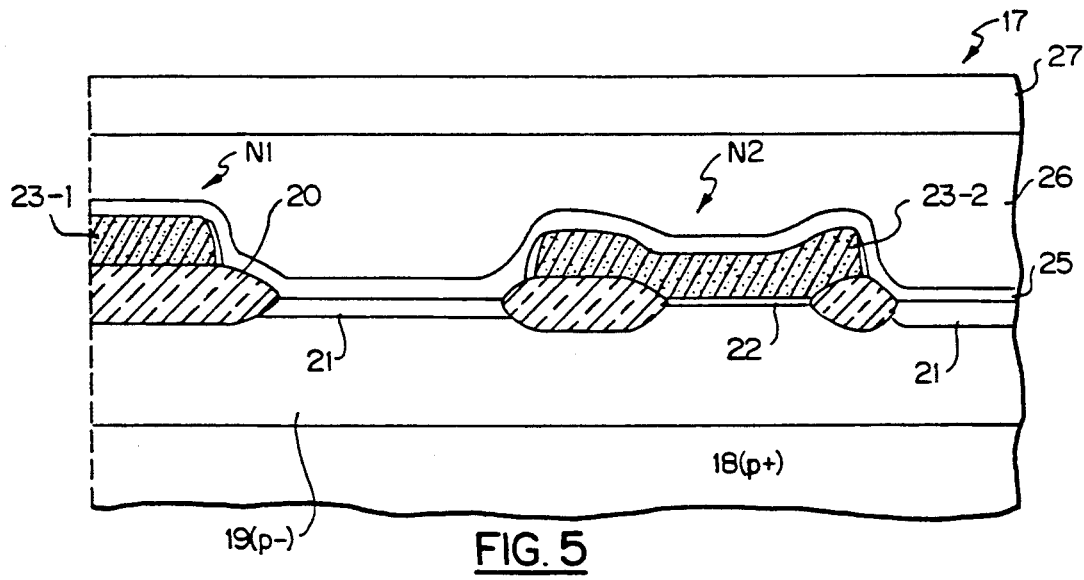
FIGS. 5-14 show the structure of FIG. 4 being processed through a sequence of processing steps in accordance with a preferred embodiment of the method of the present invention.

After a new two-step cleaning as mentioned above, the process continues with the deposition of a PECVD $SiO_2$ layer 27. The purpose of this layer is to act as a diffusion barrier layer in blocking the out-diffusion of the phosphorous dopants contained in the PSG layer into the upper layer of polysilicon to be subsequently formed. This step is completed using a standard PECVD tool. The desired thickness of layer 27 is about 200 nm. Should a non contaminating passivating and planarizing dielectric material be used, e.g. quartz, the need of layer 27 could be eliminated. Quartz is appropriate, but results in an expensive process. Organic materials, such as polyimide, are also appropriate but behave badly in hot processing steps. Finally, phosphosilicate glass (PSG) is the preferred material although it necessitates an etch stop layer and at least two diffusion barrier layers. The wafer is then annealed in a furnace at 750° C. during 1H in an N2 ambient. The resulting structure is shown in FIG. 5. This terminates the list of elements formed during the FEOL processing steps.

Figure 6:
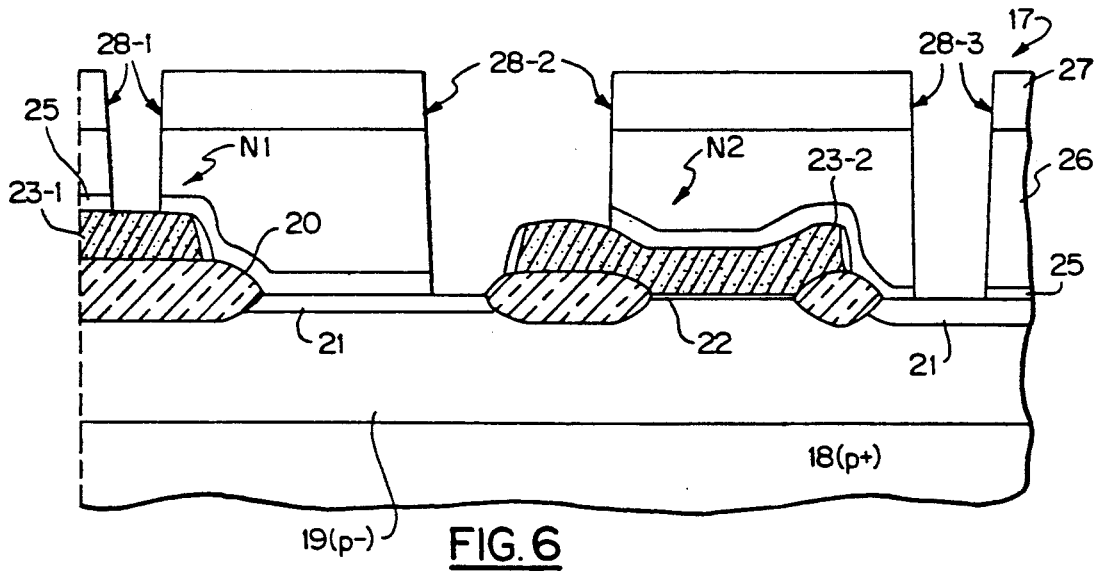

2) At this point of the process, the step of forming first stud openings is now carried out. After a new two-step cleaning, a photoresist adhesion promoter such as HMDS is applied onto the structure (prebake time 7 mn), then a standard photoresist, (e.g. the e-MERCK resin), is applied and baked. After alignment, the resist is exposed to UV light through a mask and developed to produce an in-situ resist mask (not shown) having the desired configuration. First stud openings, generically referenced 28, are formed by etching first the PECVD diffusion barrier layer 27 then, the thick PSG planarized layer 26 (and the optional pyrolitic $SiO_2$ layer mentioned above, if any) downwards to the etch stop layer 25. This step of etching can be achieved using $CHF_3/O_2$ reactive gas to supply the reactive ions. Finally, the exposed portions of the intrinsic polysilicon etch stop layer 25 are etched using either a $Cl_2/O_2/Ar$ or $HCl/O_2/Ar$ plasma. The resist is then stripped off and the structure cleaned again. Next, the structure is annealed in an ammonia ($NH_3$) ambient at 700° C. during 55 mn with $N_2$ as the carrier gas. The intrinsic polysilicon is oxidized through the thick dual passivating layer 26/27 to become fully neutral from an electrical stand-point. This step is achieved at high pressure. Finally, the exposed portions of the underlying $Si_3N_4$ layer are etched in a $SF_6$ plasma. The resulting structure provided with three first stud openings 28-1, 28-2 and 28-3 is shown in FIG. 6.

3) Now, the steps of filling the first stud openings with a highly conductive material (typically a metal, such as tungsten), and planarization are carried out. To that end, the structure of FIG. 6 is first cleaned in a 100:1 diluted HF solution and rinsed. Prior to tungsten (W) filling, a titanium (Ti) layer is deposited with a thickness of about 40 nm to plate the bottom and side-walls of the first stud openings 28-1, 28-2 and 28-3. This titanium layer prevents the diffusion of tungsten atoms in the active regions 21. Next, a thin titanium nitride (TiN) layer is formed over the titanium layer. This TiN layer is utilized to improve adhesion of the tungsten layer. This step is accomplished in the same tool, but a flow of $N_2$ is introduced in the Ar carrier gas until a thickness of 25 nm is obtained. A tungsten layer is then deposited in two steps to entirely fill the first stud openings. Firstly, deposition is carried out at a high rate of 120 nm/min. at 450° C. using a $SiH_4/WF_6/H_2/He$ gas combination until a thickness of 240 nm is attained. Then, the deposition is continued at a lower rate of 40 nm/min. in the same equipment and with the same operating conditions, except in that, $SiH_4$ is no longer used, until the desired final thickness of about 550 nm is obtained. The deposited metal layers are now planarized using either: a) a chem-mech technique, as described in commonly owned European Application No. EP-A-0223920 entitled: "Chem-mech polishing method for producing co-planar metal/insulator films on a substrate", which is incorporated herein by reference; or b) plasma etching in an etching tool using a $BCl_3/Cl_2/N_2$ gas. This step is followed by a post-clean in a double-sided brush cleaner. Planarization of the Ti-TiN and W composite layer produces first contact pads 29 and first contact studs 30 in first stud openings 28. As apparent from FIG. 7, the top surface of the first contact studs 30 is now coplanar with the surface of the PECVD oxide layer 27.

4) Next, a CVD intrinsic (non doped) polysilicon layer (POLY I) 31 is deposited at 615° C. using $SiH_4$ to reach a thickness in the 10–100 nm range. However, because the sPFET device characteristics depend strongly on the grain size of polysilicon material of layer 31, it is recommended first to convert the polysilicon in an amorphous silicon layer and then, to recrystallize it at low temperature, in order to get grains as large as possible. Amorphization can be effected by ion implantation of Si atoms in an implanter at an energy in the 25–50 KeV range and a dose of 1E15 at/cm2. The recrystallization anneal is completed in a furnace at 625° in a $N_2$ ambient for 30 hours. Alternatively, an amorphous layer of the same thickness could have been directly formed as taught in the literature. In this case, polysilicon is deposited in a PECVD equipment or in the UHV chamber of an E-beam source evaporator and the recrystallization anneal still completed in a furnace and a $N_2$ atmosphere, but at 600° C. for 12 hours.

Figure 8:
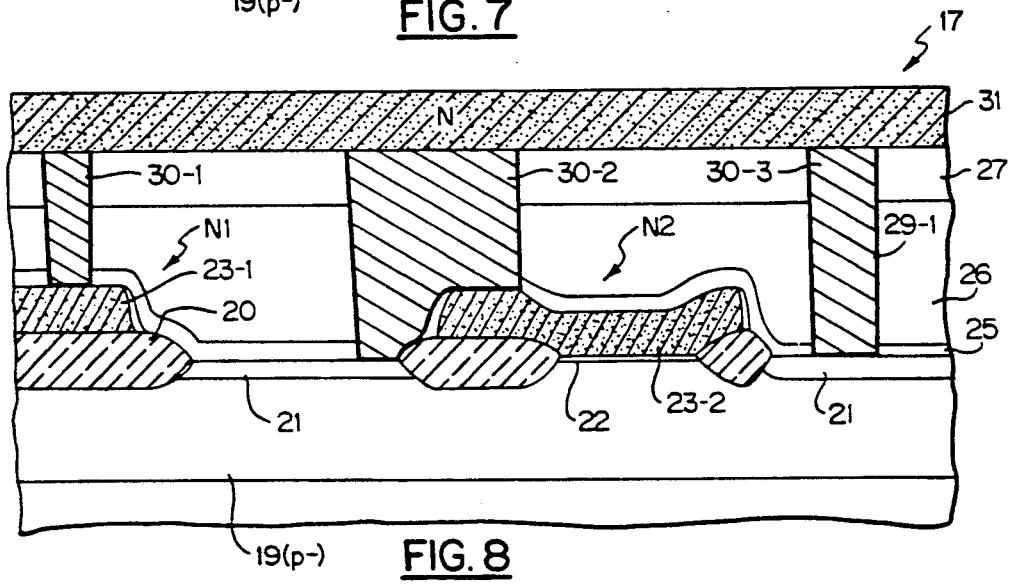

A N type dopant is now blanket implanted in the polysilicon layer to adjust the threshold voltage of the sPFET devices. As a result, the concentration in N type dopants needs to be accurately adjusted. Inherently, intrinsic polysilicon is slightly P type silicon. To that end, phosphorous ions are implanted in polysilicon layer 31 to attain a concentration of 1E17 at/cm3 in the channel region of sPFETs. This step can be achieved in an implanter and is followed by a standard implant anneal. The resulting structure is shown in FIG. 8.

Figure 9:
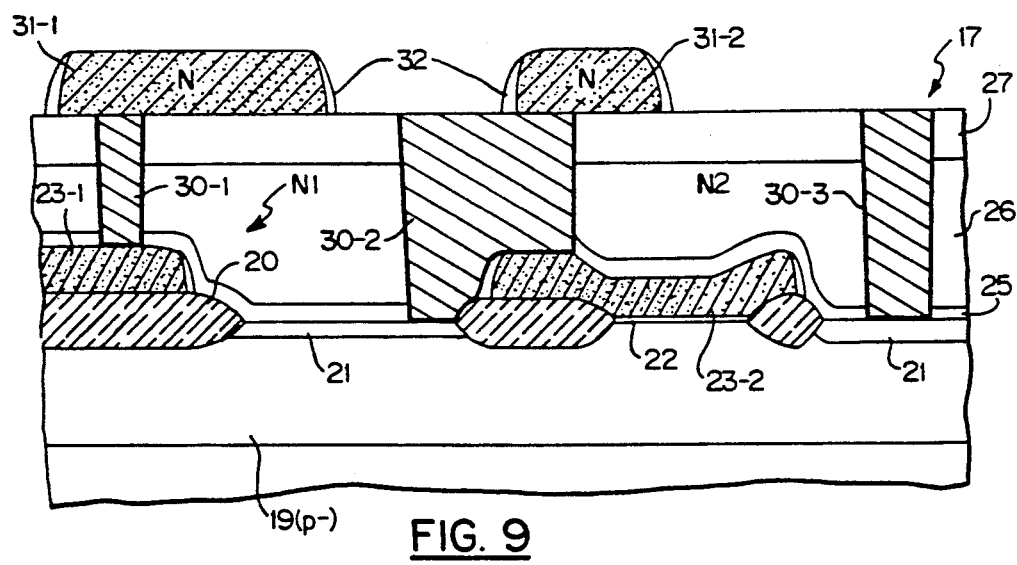

5) A photo-lithographic step (PR mask) is then performed, similar to the one previously mentioned in above point 2) to define the appropriate in-situ resist mask. This mask will be used to create the desired polysilicon land configuration in polysilicon layer 31. The structure is then submitted to RIE using a standard reactive gas composition such as $CF_4/O_2/Cl_2/HCl$ that has a high polysilicon/PECVD $SiO_2$ etch rate ratio. The photoresist is then stripped in an adequate stripper. As illustrated in FIG. 9, there remains two polysilicon lands 31-1 and 31-2 to be respectively used as the body of a sPFET device and as a polysilicon line e.g. for a cross-coupled connection. Polysilicon land 31-2 could be the extended gate electrode of a sPFET device (not shown).

Note that instead of performing the standard recrystallization anneal step mentioned above in point 4) before patterning the polysilicon layer 31, this step can be done after it, in order to have recrystallization only in the polysilicon lands. Alternatively, the recrystallization anneal could be replaced by a rapid thermal anneal (RTA) step at a temperature in the 600–700° C. range, during 10–120 s in a $N_2$ ambient.

Next, an $SiO_2$ layer 32 is deposited to provide the desired spacers to the polysilicon lands in order to smooth the sidewalls thereof. $SiO_2$ deposition is performed in a LPCVD reactor to reach a layer thickness of 50 nm. Layer 32 is then selectively removed by anisotropic RIE in the same reactor in two steps, using successively a standard $CHF_3/O_2$, then an $O_2$ atmosphere. Oxide spacers are generically referenced 32 and are apparent in FIG. 9 on the sidewalls of polysilicon lands 31-1 and 31-2.

6) Now, the gate dielectric of the sPFET devices is formed. A TEOS oxide layer 33 with a thickness of about 25 nm is deposited in a PECVD tool. After a Piranha cleaning, a new in-situ resist mask (OG mask) is applied over the structure and the oxide layer 33 is opened at the portions of the first contact studs where a contact is to be made between the polysilicon layer (POLY II) to be formed subsequently and a first contact stud. Contact openings 34 are formed in the oxide layer 33 by RIE in a $CHF_3/O_2$ ambient. The in-situ photoresist mask is stripped and the structure is cleaned again.

Figure 10:
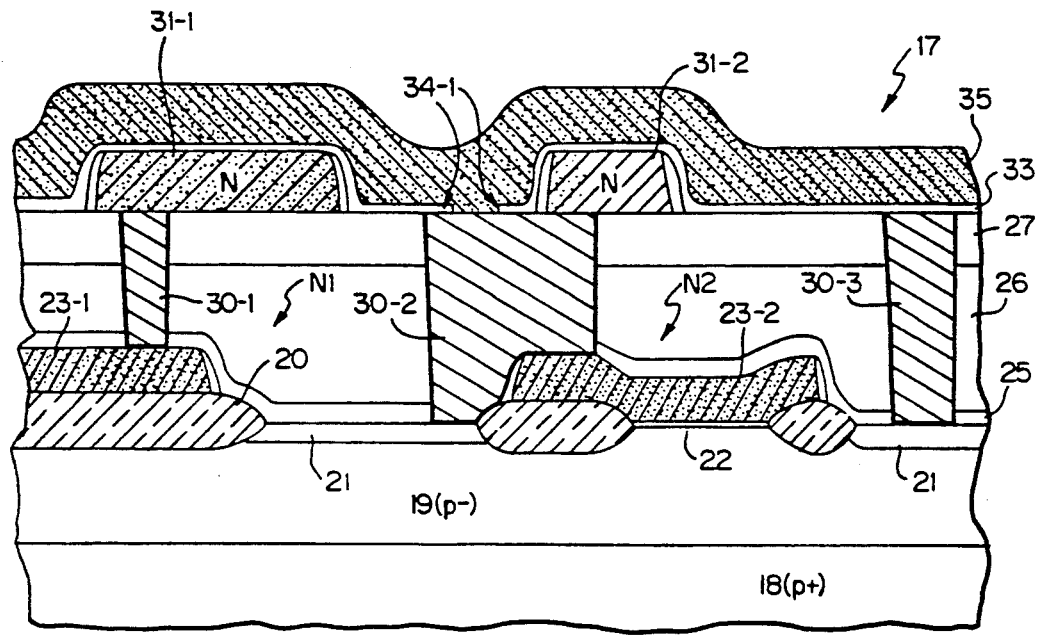

Finally, a second polysilicon layer (POLY II)35 is conformally deposited in a LPCVD reactor at a temperature of 625° using a $SiH_4$ gas to reach a thickness of about 180 nm. The resulting structure is shown in FIG. 10.

Figure 11:
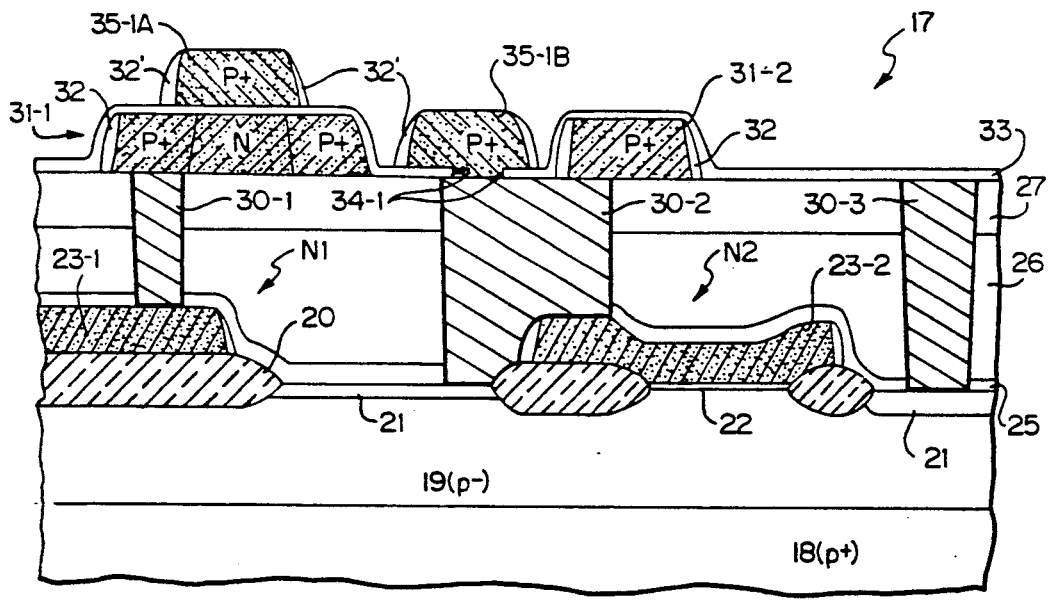

7) A new photolithographic step (GS mask) is now performed, in order to define the appropriate photoresist in-situ mask (not represented) that will be used to define the gate electrodes of the sPFET devices and interconnection conductors in polysilicon layer 35 by a RIE step. The photolithographic and RIE steps are identical to the above steps of patterning the first polysilicon layer 31. The photoresist in-situ mask is then stripped off. In FIG. 11, the remaining portion of polysilicon layer 35 is U-shaped and consists of a land referenced 35-1A forming the gate electrode of sPFET P1 and an extension thereof referenced 35-1B that comes in contact with first contact stud 30-2 underneath.

Next, an $SiO_2$ layer 32' is deposited to provide the desired spacers to the polysilicon lands in order to provide oxide spacers on the sidewalls thereof. Although not necessary, oxide spacers are highly desirable in a self- aligned process. $SiO_2$ deposition is performed in a LPCVD reactor to reach a layer thickness of 100 nm. Layer 32' is then selectively removed by anisotropic RIE in the same reactor in two steps, using successively a standard $CHF_3/O_2$, then an $O_2$ atmosphere. Oxide spacers are generically referenced 32' and are apparent from FIG. 9 on the sidewalls of polysilicon land 35-1. At this stage of the process, the structure is shown in FIG. 11.

A blanket boron ion implant (using BF2+ions) is now performed for source and drain definition along with PFET device gate electrodes and conductors doping. The implantation is performed in an implanter at a dose of 3E15 at/cm2 and an energy of 45 KeV. Thanks to the oxide spacers 32', for each sPFET, the source and drain regions formed by ion implantation are self-aligned with the gate electrode and appropriately further away from the channel region. Hence, the effective length of the latter is less sensitive to the out-diffusion of boron atoms contained in the source and drain regions towards the channel region, thereby reducing potential punch-through problems. A low temperature is then done to reactivate the dopants in the source and drain regions. This step can be completed in a furnace at a temperature ranging from 650 to 850° C. in a N2 ambient and during ½ H. Optionally, a rapid thermal anneal (RTA) can be conducted.

8) A TEOS cap oxide layer 36 is deposited over remaining polysilicon lands in a PECVD tool. The desired thickness is about 100 nm to encapsulate the whole sPFET device, and protect it from the phosphorous dopants contained in a second PSG layer to be subsequently formed. At this stage of the process, the resulting structure is shown in FIG. 12.

Figure 12:
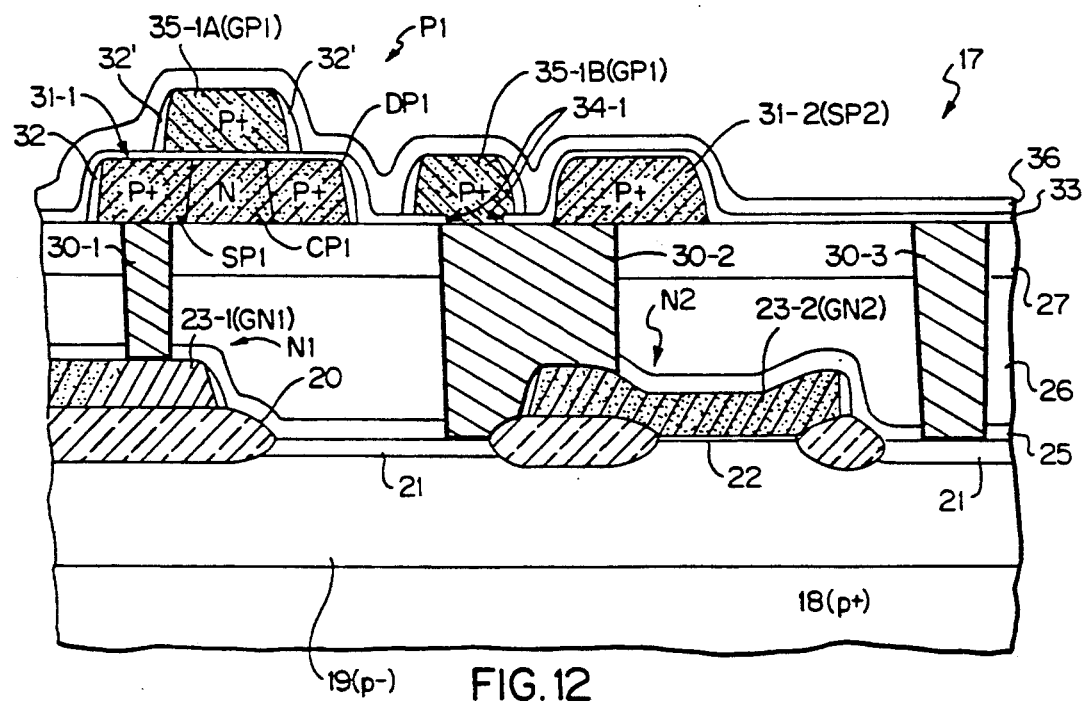

In FIG. 12, the different doped regions forming the sPFET device P1 and interconnection conductors are clearly depicted. The body of PFET device P1 comprises the source, drain, and channel regions respectively referenced SPI, DP1 and CP1. The source and drain regions respectively SP1 and DPI are completely self-aligned with the gate electrode GP1. The gate electrode GP1 of PFET device P1 is separated from the body by thin gate dielectric layer 33. Gate electrode GP1 is made of P+ polysilicon, therefore exhibiting an appropriate work function. With this construction, sPFET device P1 exhibits a surface channel instead of buried channel and therefore is less sensitive to punch-through related problems.

It should be noted that the source region SP1 of sPFET P1 makes direct contact to the gate electrode GN1 of NFET N1 underneath by first contact stud 30-1. Should a specific source or drain region be located above a first contact stud, direct contact can be made without requiring an additional mask. Also, first contact stud 30-2 shorts gate electrode GP1 (via land 35-1A/35-1B and contact opening 34-1) and source region SP2 of sPFET P2 (not shown) via land 31-2.

Figure 13:
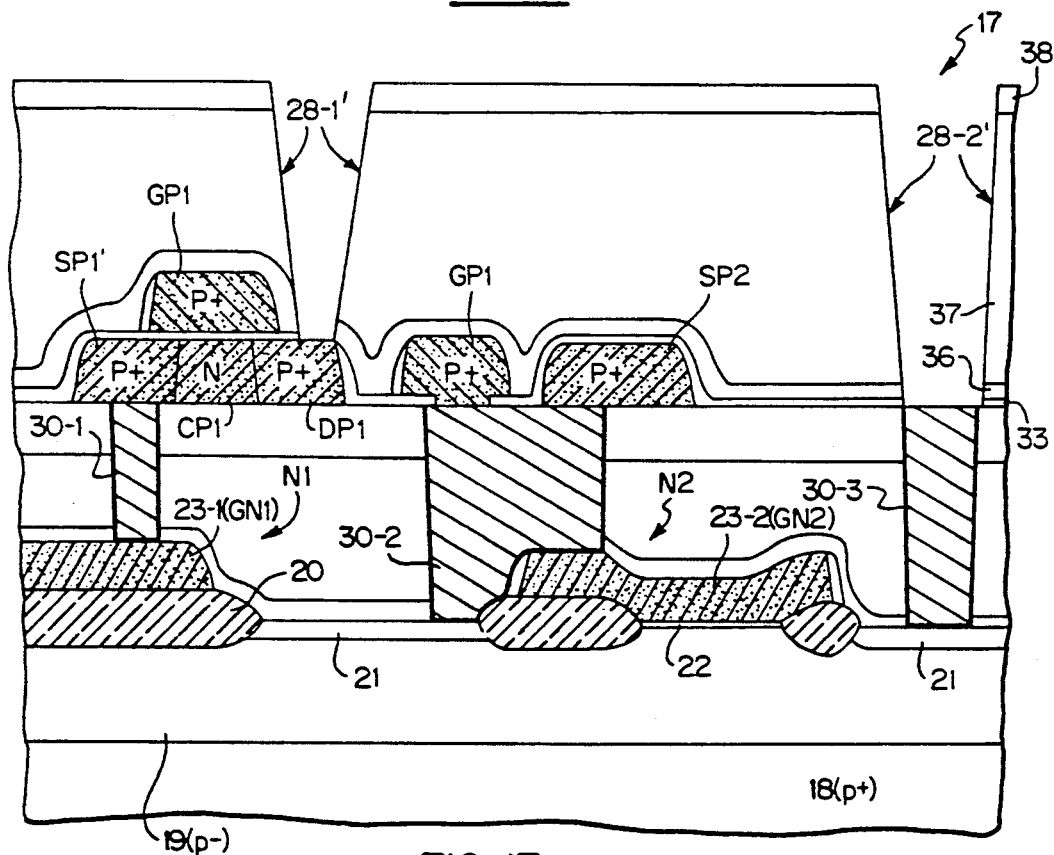

9) A second thick PSG layer 37 is then deposited after a Piranha/Huang B dual cleaning step. Layer 37 is submitted to a fine planarization as explained above. After that, an additional thin PECVD oxide or preferably PSG layer 38 is deposited thereon, in order to eliminate pin holes. The steps of depositing and planarizing are completed in the same way as described in point 2). As a result, the top surface of structure 17 is quite flat. After another Piranha/Huang B dual cleaning step, the structure is ready again for stud opening. Second stud openings 28' corresponding to the second contact studs are then opened, the etch stop layer being either the polysilicon layer 35 for the sPFET devices or tungsten for the first contact studs. The resulting structure is provided with two second stud openings 28-1' and 28-2' as shown in FIG. 13.

Figure 14:
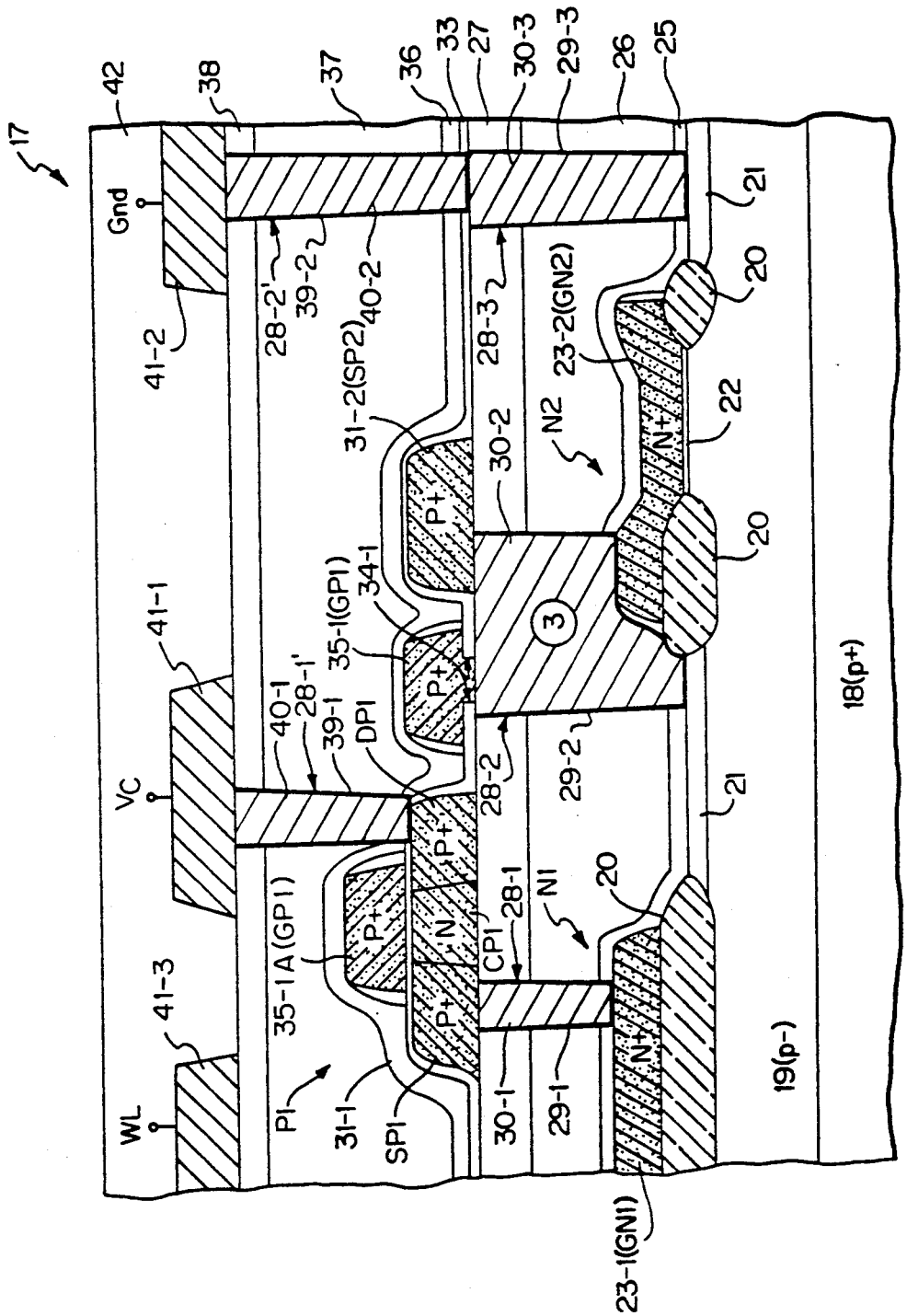

10) Next, the second stud openings 28-1', 28-2' are filled by successive deposition of a Ti layer and a Ti-N layer that are blanket sputtered on the whole wafer to form a composite Ti-TiN layer referenced 39. The second stud openings are then filled with a tungsten layer 40. The deposited metal layers are planarized with the technique described in point 3) above. Planarization of the Ti-TiN and W composite layer produces second contact pads 39-1, 39-2 and second contact studs 40-1, 40-2. Two second contact studs referenced 40-1 and 40-2 are shown in FIG. 14, and respectively contact the drain region DP1 of sPFET P1 and first contact stud 30-3. A standard first metallization layer 41 is then deposited and patterned to leave metal lands 41-1, 41-2 and 41-3 at the M1 mask level. The metallization layer may be a Ti/Al-Cu/Si metallurgy. Metal land 41-3 is used as a word line WL, while metal lands 41-1 and 41-2 are power busses and are respectively connected to Vc and Gnd. A normal BEOL process can now be used to cover the structure with an insulating film of PECVD oxide 42. The final structure is shown in FIG. 14.

In order to increase the channel mobility and decrease the threshold voltage VT, hydrogen passivation of the dangling bonds can be done. It will help to minimize the effects of the grain boundary potential barriers on device performance. This step, known in the art as the forming gas anneal step, is completed in a furnace at 400° C. during 30 mn in a $N_2/H_2$ forming gas and is performed after the POLY I layer deposition, and second contact stud formation. It can be repeated several times during the BEOL processing and at any subsequent level, to improve the structure quality.

The steps of depositing the dual insulating layer 37/38, of forming second contact studs 40-1, . . . and metal lands 41-1, . . . could be repeated again should the chip be of the multilevel type. Note that a planarization step is to be associated to each stud level. The structure fabrication is terminated by completing the terminal metallurgy steps including forming the contact pads of the Ball Limiting Metallurgy (BLM) and contact terminals (e.g. solder balls) as widely described in the literature.

It can be seen from the above process that, with only three more masks, there is provided a self-aligned sPFET device that has a high contact flexibility through the two sets of first and second contact studs. This means that the sPFET device can be connected to the active regions through first contact studs, while the connection to the M1 metal lands is made by the second contact studs. A planarization step is associated to each contact stud level and the proposed sPFET device is inserted therebetween. In addition, should both polysilicon layers POLY I and POLY II highly doped or silicided, they could also be used, if necessary, as interconnection lines or conductors. As an example, a conductive land of the first polysilicon layer (POLY I) 31 can be used as an overpass conductor, when combined with two first contact studs to form a strap, that connects two active regions or polysilicon gate electrodes at the silicon level. If it is not required that both polysilicon layers POLY I and POLY II share the same contact stud (e.g. 30-2), only two masks are necessary to insert the sPFET device (i.e. the OG mask would no longer be required).

As apparent from FIG. 14, first contact-stud 30-2 interconnects gate electrode GP1 of sPFET P1 via polysilicon land 35-1, source region SP2 of sPFET P2 via polysilicon land 31-2, gate electrode 23-2 of NFET N2 and source region 21 of NFET N3 (not shown). All these elements are at the potential of node 3 (see FIG. 1).

Typical sPFET device characteristics of the present invention are:

| | |
|---|---|
| Threshold voltage | 1.6–2.0 V |
| Oxide thickness | 20–30 nm |
| Channel mobility | 10 cm2/V.s |
| Subthreshold current | 2 pA |
| ON/OFF current ratio | 10E6 |

Figure 16:
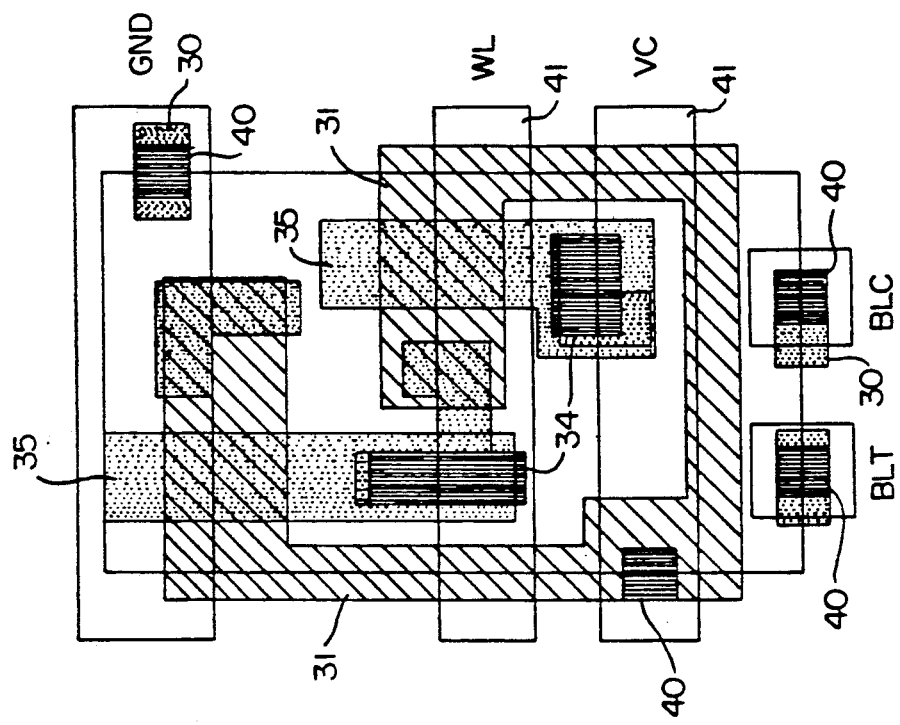
FIGS. 15 and 16 are plan views of a typical lay-out of the 6D SRAM cell with stacked self-aligned polysilicon gate PFETs as load devices of the present invention, at two different stages of the manufacturing.
Figure 15:
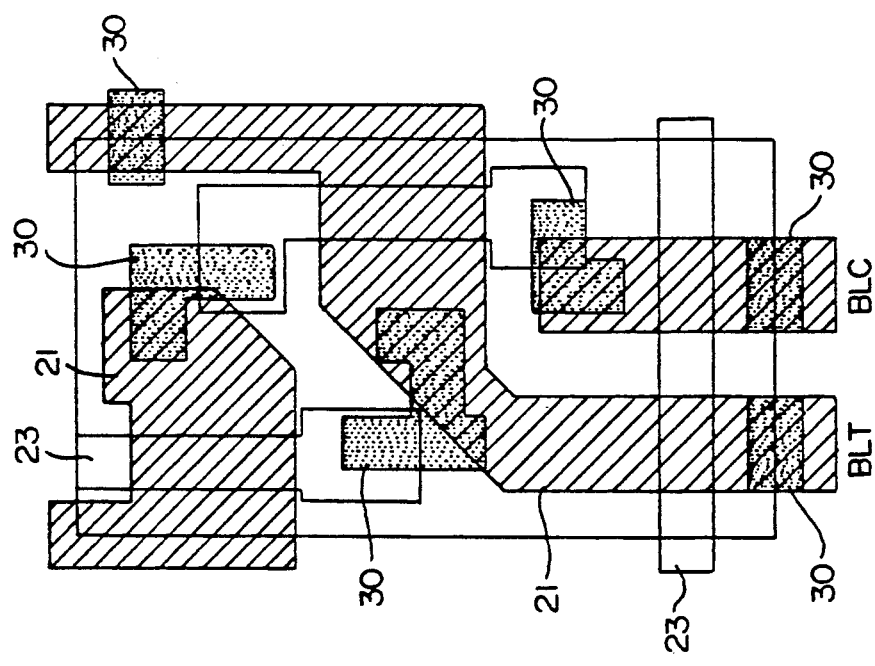

FIGS. 15 and 16 are typical views of the lay-out of the 6D SRAM cell when manufactured according to the method of the present invention at different stages of the manufacturing.

Figure 7:
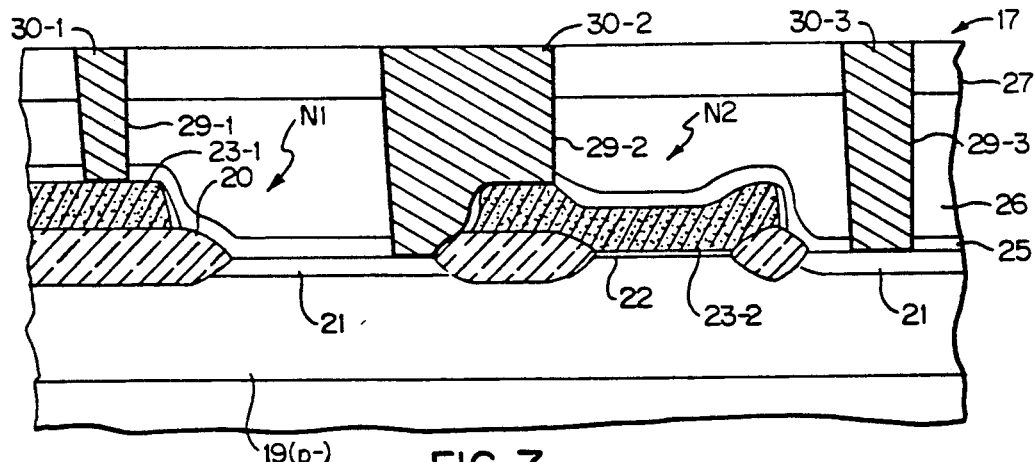

FIG. 15 shows the lay-out at the stage of FIG. 7 just before deposition of polysilicon layer 31.

FIG. 16 shows the lay-out corresponding to the structure at the stage of FIG. 14 when the metal lands defining the power busses (Vc, Gnd) and the word line (WL) have been defined.

Although the invention has been shown and described with exemplary embodiments thereof, it should be understood by those skilled in the art that the foregoing and various other changes, omissions and additions may be made therein and thereto without departing from the spirit and scope of the invention.

We claim:

1. A method of forming self-aligned stacked polysilicon gate PFET devices on a semiconductor IC base structure having active regions of devices and/or polysilicon lines formed therein comprising the steps of:

a) depositing a first thick passivating layer of a dielectric material that can be planarized onto the base structure;

b) forming a plurality of first stud openings in said first thick passivating layer exposing at least one active region and/or one of said polysilicon lines;

c) depositing a first conductive material layer, to thereby fill said first stud openings and define a set of first contact studs;

d) planarizing the structure to make the top surface of said first contact-studs coplanar with the surface of said first thick passivating layer;

e) depositing a first polysilicon layer lightly doped with an impurity of a first type of conductivity;

f) patterning said first polysilicon layer to define a plurality of first polysilicon lands to be used at least as the body of PFET devices alone or also as interconnection conductors or both contacting said first contact studs at desired locations;

g) depositing a thin insulating layer to form the gate dielectric of PFET devices;

h) depositing a second polysilicon layer and patterning it to define a plurality of second polysilicon lands, to be used either as the gate electrodes of the said PFET devices or as interconnection conductors;

i) blanket implanting ions of a second type of conductivity to: 1) define self-aligned source and drain regions in said first polysilicon lands using the gate electrodes of said PFET devices as a block-out mask; and 2) dope said gate electrodes and interconnection conductors;

j) depositing a second thick passivating layer of a dielectric material that can be planarized;

k) forming a set of second stud openings in said second thick passivating layer to thereby expose desired portions of said first and/or second polysilicon lands and/or portions of said first contact studs;

l) depositing a second conductive material layer to thereby fill said second stud openings and define a set of second contact studs; and, m) planarizing the structure to make the top surface of said second contact studs coplanar with the surface of said second thick passivating layer.

2. A method of forming self-aligned stacked polysilicon gate PFET devices on a semiconductor IC base structure having active regions of devices and/or polysilicon lines formed therein, according to claim 1, wherein said thin insulating layer is patterned to define contact openings in order to expose certain first contact studs at desired locations to allow contacting to first contact studs through said contact openings.

3. A method of forming self-aligned stacked polysilicon gate PFET devices on a semiconductor IC base structure having active regions of devices and/or polysilicon lines formed therein, according to claim 2, further comprising the step of:

n) forming oxide spacers on the sidewalls of said second polysilicon lands prior to step j).

4. A method of forming self-aligned stacked polysilicon gate PFET devices on a semiconductor IC base structure having active regions of devices and/or polysilicon lines formed therein, according to claim 1, further comprising the step of:

o) depositing an etch stop layer prior to depositing said first thick passivating layer.

5. A method of forming self-aligned stacked polysilicon gate PFET devices on a semiconductor IC base structure having active regions of devices and/or polysilicon lines formed therein, according to claim 4, further comprising the step of:
   p) depositing a diffusion barrier layer onto said base structure prior to step a).

6. A method of forming self-aligned stacked polysilicon gate PFET devices on a semiconductor IC base structure having active regions of devices and/or polysilicon lines formed therein, according to claim 5, wherein said etch stop layer and said diffusion barrier layer are comprised of intrinsic polysilicon and $Si_3N_4$ respectively.

7. A method of forming self-aligned stacked polysilicon gate PFET devices on a semiconductor IC base structure having active regions of devices and/or polysilicon lines formed therein, according to claim 1, wherein step a) comprises the steps of:
   a1) depositing a thick layer of PSG;
   a2) planarizing said thick layer of PSG; and,
   a3) depositing a thin layer of LPCVD oxide over the PSG layer to act as a diffusion barrier to the dopants contain therein.

8. A method of forming self-aligned stacked polysilicon gate PFET devices on a semiconductor IC base structure having active regions of devices and/or polysilicon lines formed therein, according to claim 1, further comprising the step of:
   q) depositing a cap layer over said second polysilicon lands prior to depositing said second thick passivating layer.

9. A method of forming self-aligned stacked polysilicon gate PFET devices on a semiconductor IC base structure having active regions of devices and/or polysilicon lines formed therein, according to claim 8, wherein said cap layer is comprised of a TEOS oxide.

10. A method of forming self-aligned stacked polysilicon gate PFET devices on a semiconductor IC base structure having active regions of devices and/or polysilicon lines formed therein, according to claim 1, wherein step j) comprises the steps of:
    j1) depositing a thick layer of PSG;
    j2) planarizing said thick layer of PSG; and,
    j3) depositing a thin layer of either LPCVD oxide or PSG.

11. A method of forming self-aligned stacked polysilicon gate PFET devices on a semiconductor IC base structure having active regions of devices and/or polysilicon lines formed therein, according to claim 1, further comprising the steps of:
    r1) blanket depositing an oxide layer over the structure prior to step g); and,
    r2) anisotropically RIE etching the structure to leave oxide spacers onto the sidewalls of said first polysilicon lands.

12. A method of forming self-aligned stacked polysilicon gate PFET devices on a semiconductor IC base structure having active regions of devices and/or polysilicon lines formed therein, according to claim 1, further comprising the steps of:
    s1) depositing a metal layer onto the structure;
    s2) patterning said metal layer to form metal lands in contact with at least one of said second contact studs; and,
    s3) depositing an insulating film onto the structure.

13. A method of forming self-aligned stacked polysilicon gate PFET devices on a semiconductor IC base structure having active regions of devices and/or polysilicon lines formed therein, according to claim 1, wherein said steps d) and m) are comprised of chem-mech techniques.

14. A method of forming self-aligned stacked polysilicon gate PFET devices on a semiconductor IC base structure having active regions of devices and/or polysilicon lines formed therein, according to claim 1, wherein steps c) and l) comprise the steps of:
    c1) forming a Ti-TiN composite layer on the bottom and side walls of said first and second stud openings; and,
    c2) filling said second stud openings with a tungsten layer.

* * * * *